＃US011387839B2

United States Patent
Shih et al.

(10) Patent No.: US 11,387,839 B2
(45) Date of Patent: Jul. 12, 2022

(54) CONTROL CIRCUIT FOR SUCCESSIVE APPROXIMATION REGISTER ANALOG-TO-DIGITAL CONVERTER

(71) Applicant: REALTEK SEMICONDUCTOR CORPORATION, Hsinchu (TW)

(72) Inventors: Sheng-Yen Shih, Hsinchu (TW); Shih-Hsiung Huang, Hsinchu (TW); Yu-Chang Chen, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/360,083

(22) Filed: Jun. 28, 2021

(65) Prior Publication Data
US 2022/0116050 A1 Apr. 14, 2022

(30) Foreign Application Priority Data
Oct. 12, 2020 (TW) .................. 109135127

(51) Int. Cl.
*H03M 1/46* (2006.01)
*H03M 1/40* (2006.01)
*H03M 1/38* (2006.01)

(52) U.S. Cl.
CPC ........... *H03M 1/466* (2013.01); *H03M 1/403* (2013.01); *H03M 1/462* (2013.01); *H03M 1/38* (2013.01)

(58) Field of Classification Search
CPC .......... H03M 1/38; H03M 1/40; H03M 1/403; H03M 1/462; H03M 1/466

USPC .......................................... 341/161, 163, 172
See application file for complete search history.

(56) References Cited

U.S. PATENT DOCUMENTS

| 8,395,538 | B2 | 3/2013 | Das et al. | |
| 10,432,181 | B2 | 10/2019 | Chen et al. | |
| 10,516,408 | B2 * | 12/2019 | Bodnar | H03M 1/145 |
| 10,804,917 | B1 * | 10/2020 | Chang | H03M 1/38 |

OTHER PUBLICATIONS

OA letter of the counterpart TW application (appl. No. 109135127) dated May 14, 2021. Summary of the OA letter: Claim 1 is rejected under Patent Law Article 22(1) as being anticipated by reference 1 (U.S. Pat. No. 8,395,538 B2).

* cited by examiner

*Primary Examiner* — Khai M Nguyen
(74) *Attorney, Agent, or Firm* — WPAT, PC

(57) ABSTRACT

A control circuit for a successive approximation register analog-to-digital converter (SAR ADC). The SAR ADC includes a comparator and a switched-capacitor digital-to-analog converter (DAC). The switched-capacitor DAC includes a target capacitor. A first terminal of the target capacitor is coupled to an input terminal of the comparator. A second terminal of the target capacitor is coupled to a first reference voltage through a first switch and coupled to a second reference voltage through a second switch. The control circuit includes a third switch and a buffer circuit. The third switch is coupled between the first reference voltage and the second terminal of the target capacitor. The buffer circuit is coupled to the first switch and the third switch for controlling the first switch and the third switch based on a control signal.

10 Claims, 7 Drawing Sheets

CONTROL CIRCUIT FOR SUCCESSIVE APPROXIMATION REGISTER ANALOG-TO-DIGITAL CONVERTER

BACKGROUND OF THE INVENTION

1. Field of the Invention

The present invention generally relates to a successive approximation register (SAR) analog-to-digital converter (ADC) (hereinafter referred to as SAR ADC), and, more particularly, to the control circuit for the SAR ADC.

2. Description of Related Art

In the following description, two terminals of a capacitor are defined as a top plate and a bottom plate, respectively; the top plate refers to the terminal coupled to the comparator, whereas the bottom plate refers to the terminal not coupled to the comparator. Such definition is made only for the ease of discussion and not necessarily related to "top" and "bottom" in the actual circuit.

FIG. 1 is a functional block diagram of a conventional successive approximation register analog-to-digital converter (SAR ADC). The SAR ADC is used to convert the analog input signal Vi into a digital signal (i.e., the digital code D). The SAR ADC primarily includes a switched-capacitor digital-to-analog converter (DAC) 110, a comparator 120, a successive approximation register (SAR) 130, and a control circuit 140. The SAR ADC operates according to the clock CLK. In a certain operation of the SAR ADC, the SAR 130 determines a bit value (1/0) of one bit of the digital code D according to the comparison result of the comparator 120, and the control circuit 140 generates the control signal G according to the digital code D. The control signal G controls the terminal voltage of the capacitors in the switched-capacitor DAC 110 (i.e., controlling the bottom plate of the capacitor to be coupled to the reference voltage Vref1 or the reference voltage Vref2), so that the charges on the capacitors redistribute, which in turn leads to a change in the voltage of the inverting input (negative terminal) or the voltage of the non-inverting input (positive terminal) of the comparator 120. As a result, the voltages to be compared by the comparator 120 in the subsequent comparison operation change. The above steps are repeated to determine the digital code D bit by bit (from the most significant bit (MSB) to the least significant bit (LSB)); meanwhile, the value that the digital code D represents gradually approaches the input signal Vi.

FIG. 2 shows an internal circuit of the switched-capacitor DAC 110. The switched-capacitor DAC 110 includes two capacitor arrays, each of which includes n capacitors (C1 to Cn or C1' to Cn') and n switches (SW1 to SWn or SW1' to SWn') (n is a positive integer), meaning that the digital code D contains n+1 bits (D1 to Dn+1, D1 being the LSB and Dn+1 being the MSB), and the control signal G contains n sub-control signals G1 to Gn and n sub-control signals #G1 to #Gn. The sub-control signals G1 to Gn (or #G1 to #Gn) correspond to the bits D2 to Dn+1, respectively. The switch SWk and the switch SWk' are controlled by the sub-control signals Gk and #Gk, respectively (k is an integer and 1≤k≤n). More specifically, when the switch SWk is switched to the reference voltage Vref1, the switch SWk' is switched to the reference voltage Vref2; when the switch SWk is switched to the reference voltage Vref2, the switch SWk' is switched to the reference voltage Vref1. FIG. 2 also shows that the input signal Vi is a differential signal, which is made up of the signals Vip and Vin, and the switch SWip and the switch SWin are used to sample the input signal Vi.

Each switch SWk (or SWk') includes a first sub-switch and a second sub-switch. The first sub-switch is coupled between the bottom plate of the capacitor Ck (or Ck') and the reference voltage Vref1, and the second sub-switch is coupled between the bottom plate of the capacitor Ck (or Ck') and the reference voltage Vref2. The first sub-switch and the second sub-switch, which are controlled by the sub-control signal Gk (or #Gk), are turned on (closed) or off (open) to couple the bottom plate of the capacitor Ck (or Ck') to the reference voltage Vref1 or the reference voltage Vref2.

FIG. 3 is a circuit diagram of the comparator 120. The comparator 120 mainly includes a transistor 121 and a transistor 126. When the comparator 120 switches from the reset state (when switch 125 is turned on) to the comparison state (when switch 125 is turned off), the signals on the output terminal Vo− and the output terminal Vo+ are kicked back to the negative terminal Vi− and the positive terminal Vi+ of the comparator 120 through the parasitic capacitor 122 of the transistor 121 and the parasitic capacitor 127 of the transistor 126, respectively.

It can be seen from FIGS. 2 and 3 that the equivalent impedance coupled to the negative terminal (or positive terminal) of the comparator 120 depends intimately on the configuration of the switches SW1 to SWn (or SW1' to SWn'), and the configuration of the switches SW1 to SWn (or SW1' to SWn') is associated with the input signal Vi. When the two input terminals of the comparator 120 do not match in the equivalent impedance, the kickback noise may cause the comparator 120 to generate an incorrect comparison result, which leads to poor performance or incorrectness of the SAR ADC. The impedance mismatch between the first sub-switch and the second sub-switch is a main reason for the equivalent impedance mismatch between the two input terminals of the comparator 120.

SUMMARY OF THE INVENTION

In view of the issues of the prior art, an object of the present invention is to provide a control circuit for a SAR ADC, so as to make an improvement to the prior art.

A control circuit for a successive approximation register analog-to-digital converter (SAR ADC) is provided. The SAR ADC includes a comparator and a switched-capacitor digital-to-analog converter (DAC). The switched-capacitor DAC includes a target capacitor. A first terminal of the target capacitor is coupled to an input terminal of the comparator, and a second terminal of the target capacitor is coupled to a first reference voltage through a first switch and coupled to a second reference voltage through a second switch. The control circuit includes a third switch and a buffer circuit. The third switch is coupled between the first reference voltage and the second terminal of the target capacitor. The buffer circuit is coupled to the first switch and the third switch and configured to control the first switch and the third switch based on a control signal. When the first switch and the third switch are turned on, the second switch is turned off, and when the second switch is turned on, the first switch and the third switch are turned off.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be interpreted accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes a control circuit for a SAR ADC. On account of that some or all elements of the control circuit for the SAR ADC could be known, the detail of such elements is omitted provided that such detail has little to do with the features of this disclosure, and that this omission nowhere dissatisfies the specification and enablement requirements. A person having ordinary skill in the art can choose components or steps equivalent to those described in this specification to carry out the present invention, which means that the scope of this invention is not limited to the embodiments in the specification.

Figure 1:
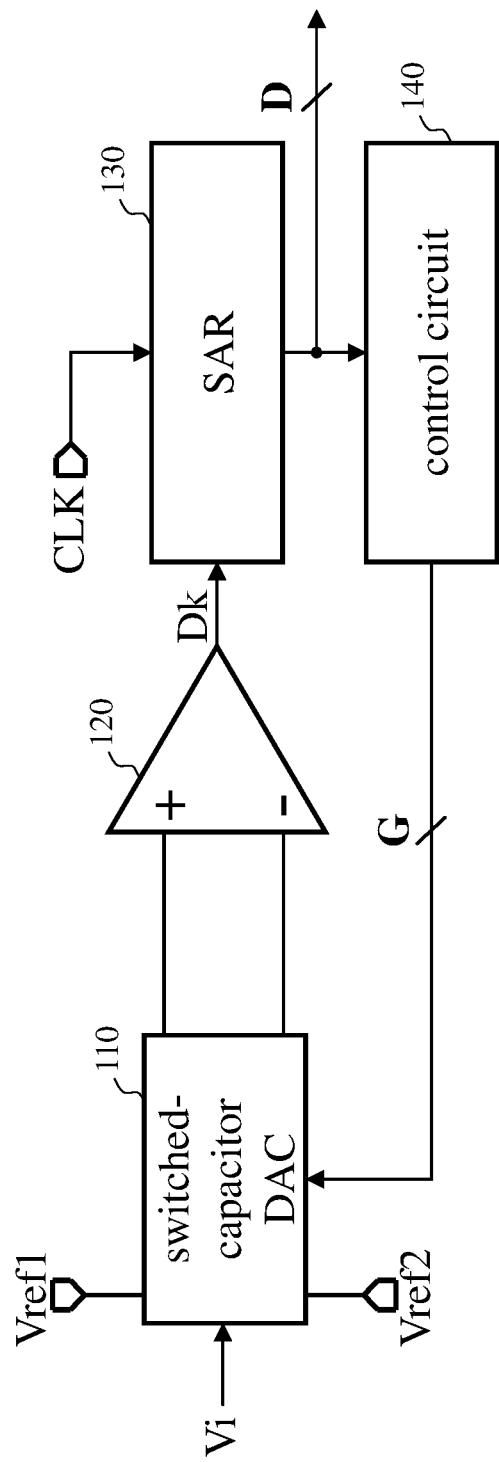
FIG. 1 is a functional block diagram of a conventional SAR ADC.
Figure 2:
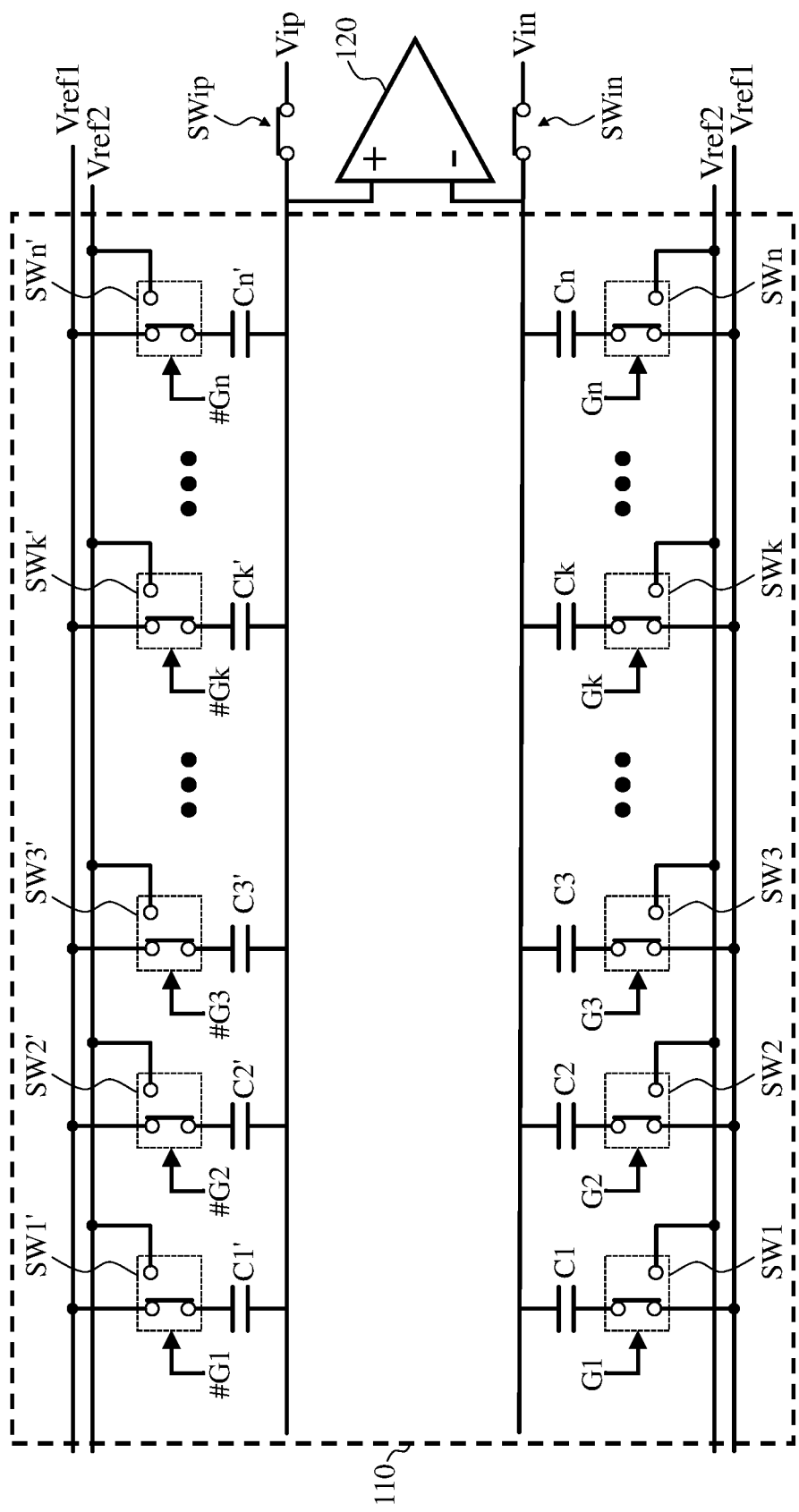
FIG. 2 shows the internal circuit of a switched-capacitor DAC.
Figure 3:
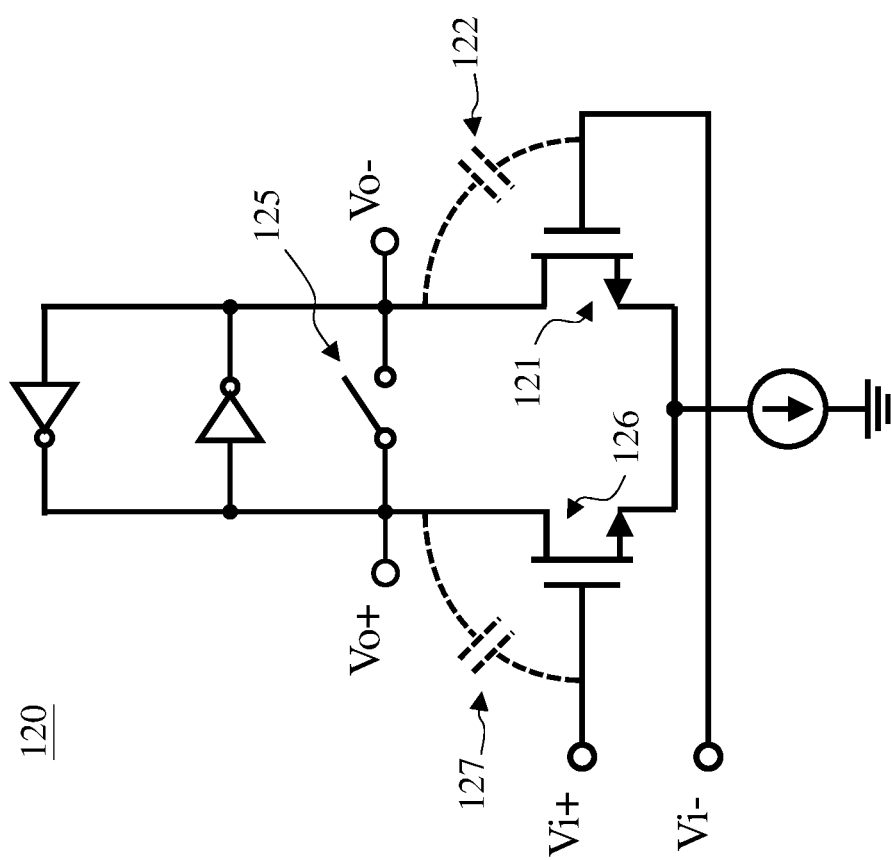
FIG. 3 is a circuit diagram of a comparator.

Reference is made to FIG. 2. The better the equivalent impedance between the bottom plate of the capacitor Ck (hereinafter referred to as the target capacitor) and the reference voltage Vref1 matches the equivalent impedance between the bottom plate of the target capacitor Ck and the reference voltage Vref2, the less the equivalent impedances seen by the two input terminals of the comparator 120 are affected by the configuration of the switches (SW1 to SWn and SW1' to SWn'), that is, the better the equivalent impedance coupled to the negative terminal of the comparator 120 matches the equivalent impedance coupled to the positive terminal of the comparator 120. Some embodiments are provided below to improve the impedance matching between the two input terminals of the comparator 120.

Figure 4:
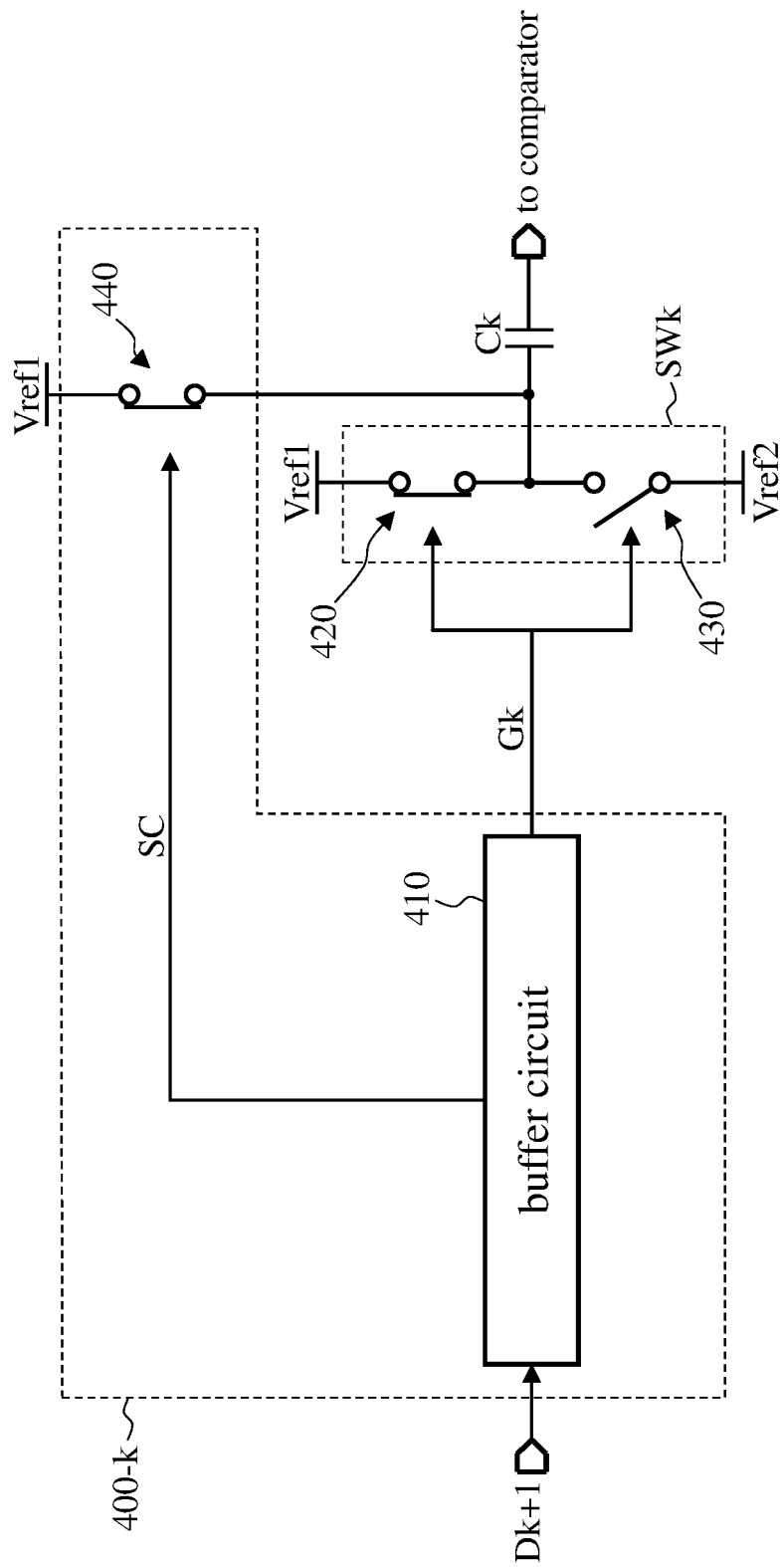
FIG. 4 is a circuit diagram of the sub-control circuit according to an embodiment of the present invention.

FIG. 4 is a circuit diagram of the sub-control circuit according to an embodiment of the present invention. The sub-control circuit is a part of the control circuit for the SAR ADC. The sub-control circuit 400-$k$ generates the sub-control signal Gk based on the control signal (i.e., the value of the bit Dk+1). The sub-control circuit 400-$k$ includes a buffer circuit 410 (which can also be referred to as a driving circuit that drives the switch 420 and the switch 430 to turn on) and a switch 440. The switch SWk includes the switch 420 and the switch 430. The first terminal (i.e., the top plate) of the target capacitor Ck is coupled to the comparator of the SAR ADC, and the second terminal (i.e., the bottom plate) of the target capacitor Ck is coupled to the reference voltage Vref1 through the switch 420 as well as to the reference voltage Vref2 through the switch 430. The bottom plate of the target capacitor Ck is further coupled to the reference voltage Vref1 through the switch 440. The buffer circuit 410 generates a sub-control signal Gk based on the control signal, and the sub-control signal Gk turns on/off the switch 420 and the switch 430. The switch 420 and the switch 430 are not substantially turned on at the same time. More specifically, except for the extremely short switching transient when the switch 420 and the switch 430 are both switching, the two switches are not turned on at the same time. In addition to the sub-control signal Gk, the buffer circuit 410 further generates a switch control signal SC based on the control signal. The switch control signal SC is used to control whether the switch 440 is turned on. When the switch 420 and the switch 440 are turned on, the switch 430 is turned off, and when the switch 430 is turned on, the switch 420 and the switch 440 are turned off.

The switch 420, the switch 430, and the switch 440 can be embodied by a Metal Oxide Semiconductor Field Effect Transistor (MOSFET). In some embodiments, the switch 420, the switch 430, and the switch 440 may be embodied by a single MOSFET or a transmission gate composed of multiple MOSFETs. In some embodiments, the turn-on resistance of the switch 420 is smaller than that of the switch 440 (i.e., the aspect ratio of the switch 420 is larger than that of the switch 440); therefore, relative to the switch 440, the switch 420 requires a larger driving force to be turned on. In other words, the switch 420 should be driven by a relatively large buffer circuit which is inevitably large in gate delay, whereas the switch 440 can be driven by a relatively small buffer circuit which has a relatively small gate delay. In other words, with such a design, the switch 440 is turned on earlier than the switch 420.

When the bottom plate of the target capacitor Ck should receive the reference voltage Vref1, the sub-control circuit 400-$k$ turns on the switch 420 and turns off the switch 430 through the sub-control signal Gk and turns on the switch 440 through the switch control signal SC. Because the switch 440 is turned on earlier than the switch 420, the bottom plate of the target capacitor Ck is coupled to the reference voltage Vref1 through the switch 440, and then (after one or more gate delay(s)) the switch 420 is turned on. When the switch 440 and the switch 420 are both turned on, the bottom plate of the target capacitor Ck is coupled to the reference voltage Vref1 through both the switch 420 and the switch 440. The fast turn-on property of the switch 440 facilitates relatively early reception of the target voltage by the bottom plate of the target capacitor Ck (compared to the case where the switch 440 is absent), which helps the switched-capacitor DAC of SAR ADC to stabilize faster (in other words, the SAR ADC can operate at higher speeds). On the other hand, the presence of the switch 440 renders the equivalent turn-on resistance between the bottom plate of the target capacitor Ck and the reference voltage Vref1 relatively low (compared to the case where the switch 440 is absent). That is to say, when the turn-on resistance of the switch 420 is greater than that of the switch 430 (e.g., caused by the semiconductor manufacturing process), the switch 440 can lower the equivalent impedance between the bottom plate of the target capacitor Ck and the reference voltage Vref1, which causes the impedance between the bottom plate of the target capacitor Ck and the reference voltage Vref1 to better match the impedance between the bottom plate of the target capacitor Ck and the reference voltage Vref2.

Figure 5:
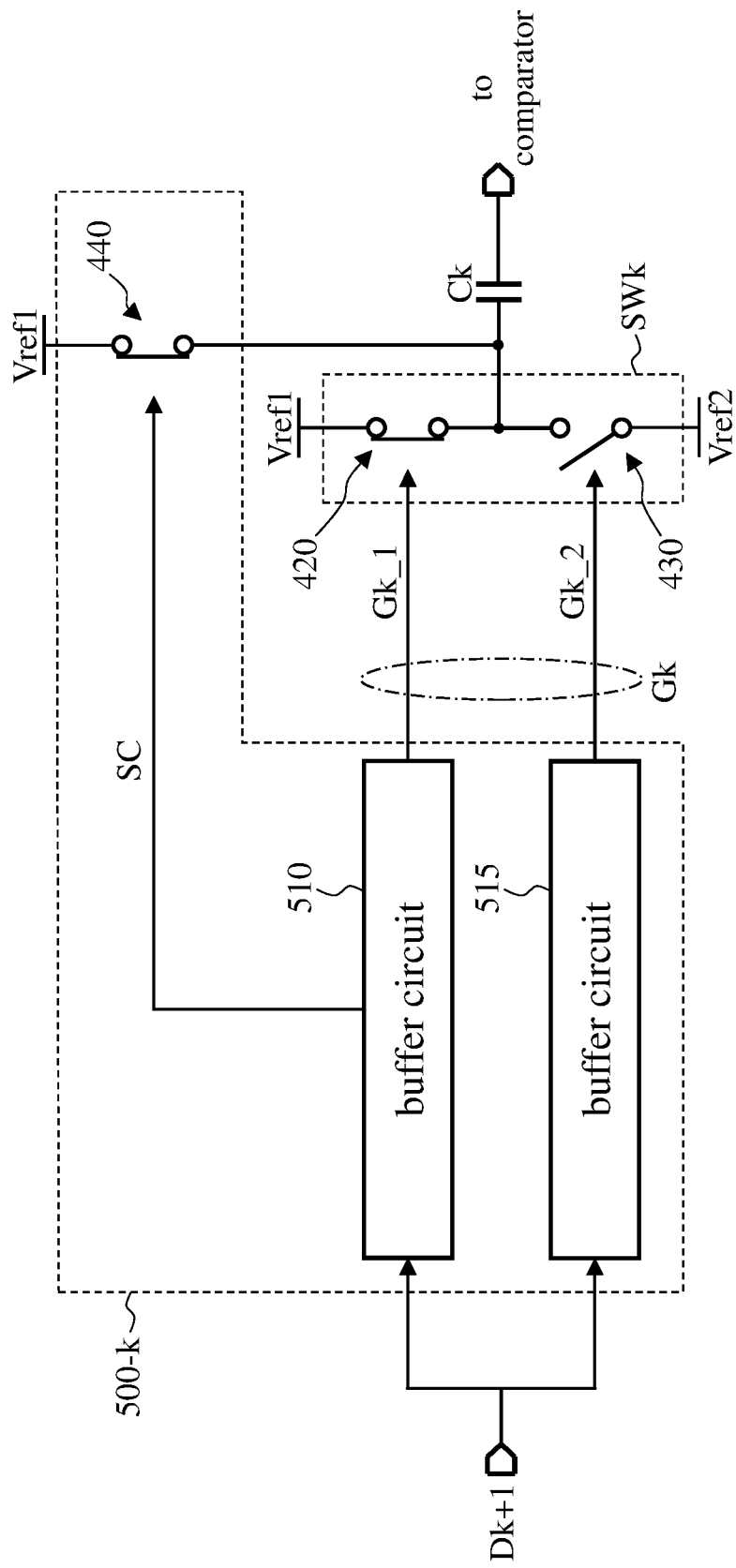
FIG. 5 is a circuit diagram of the sub-control circuit according to another embodiment of the present invention.

FIG. 5 is a circuit diagram of the sub-control circuit according to another embodiment of the present invention. The sub-control circuit is a part of the control circuit for the SAR ADC. The sub-control circuit 500-$k$ generates the sub-control signal Gk based on the control signal (i.e., the value of the bit Dk+1). The sub-control signal Gk includes a switch control signal Gk_1 and a switch control signal Gk_2. The switch control signal Gk_1 turns on/off the switch 420, and the switch control signal Gk_2 turns on/off the switch 430. In this embodiment, the sub-control circuit 500-$k$ includes two buffer circuits: a buffer circuit 510 and a buffer circuit 515. The buffer circuit 510 generates the switch control signal Gk_1 and the switch control signal SC based on the control signal, and the buffer circuit 515 generates the switch control signal Gk_2 based on the control signal. In some embodiments, the switch 420 and the switch 430 are embodied by different types of MOSFETs, and the switch control signal Gk_1 and the switch control signal Gk_2 are of the same voltage level. For example, the switch 420 is embodied by a P-type MOSFET (hereinafter referred to as PMOS), and the switch 430 is embodied by an N-type MOSFET (hereinafter referred to as NMOS). In some cases, the buffer circuit 510 and the buffer circuit 515 can be collectively regarded as a larger integral buffer circuit.

Figure 6:
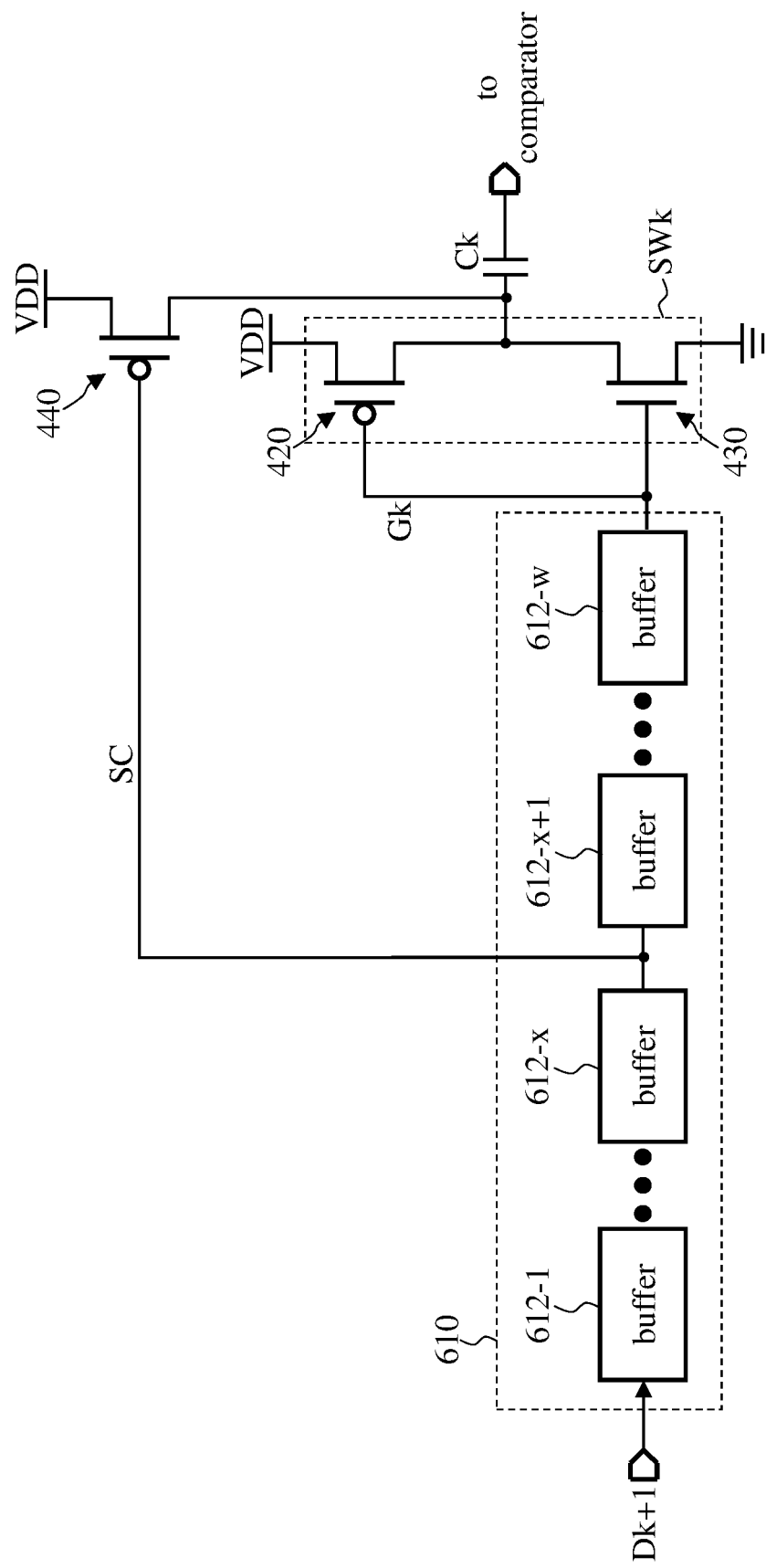
FIG. 6 is a circuit diagram of the sub-control circuit according to another embodiment of the present invention.

FIG. 6 is a circuit diagram of the sub-control circuit according to another embodiment of the present invention. The sub-control circuit is a part of the control circuit for the SAR ADC. In this embodiment, the switch 420 and the switch 430 are respectively embodied by a PMOS and an NMOS (which collectively constitute an inverter, that is, the switch SWk is embodied by an inverter), and the switch 440 is embodied by a PMOS. The reference voltage Vref1 is the power supply voltage source VDD of the SAR ADC, while the reference voltage Vref2 is ground which is of a voltage level lower than the power supply voltage source VDD. The buffer circuit 610 includes w serially connected buffers 612 (612-1, . . . , 612-$x$, 612-$x$+1, . . . , 612-$w$, w>x≥1). The buffer can also be referred to as a driver, and each buffer 612 can be an inverter. The buffer circuit 610 generates the sub-control signal Gk and the switch control signal SC based on the control signal. More specifically, there are x buffers 612 between the control signal and the switch control signal SC, and there are w buffers 612 between the control signal and the sub-control signal Gk. Both w and x are odd numbers, which means that the switch control signal SC and the sub-control signal Gk are of the same voltage level. Since w>x, after the level of the control signal transitions, the switch control signal SC makes a level transition before the sub-control signal Gk. In other words, there is a delay between the switch control signal SC and the sub-control signal Gk (which delay is approximately equivalent to the delay of (w−x) buffer(s) 612). For example, when the value of the bit Dk+1 changes from 0 to 1, the switch 440 is turned on first (to quickly switch the voltage of the bottom plate of the target capacitor Ck), and then the switch 420 is turned on (to make the voltage of the bottom plate of the target capacitor Ck closer to the power supply voltage source VDD, that is, to further lower the equivalent impedance between the bottom plate of the target capacitor Ck and the power supply voltage source VDD).

It should be noted that when the target capacitor in FIG. 6 is the capacitor Ck' instead of the capacitor Ck (i.e., when the sub-control circuit is coupled to the positive terminal of the comparator 120), w and x are both even numbers.

Figure 7:
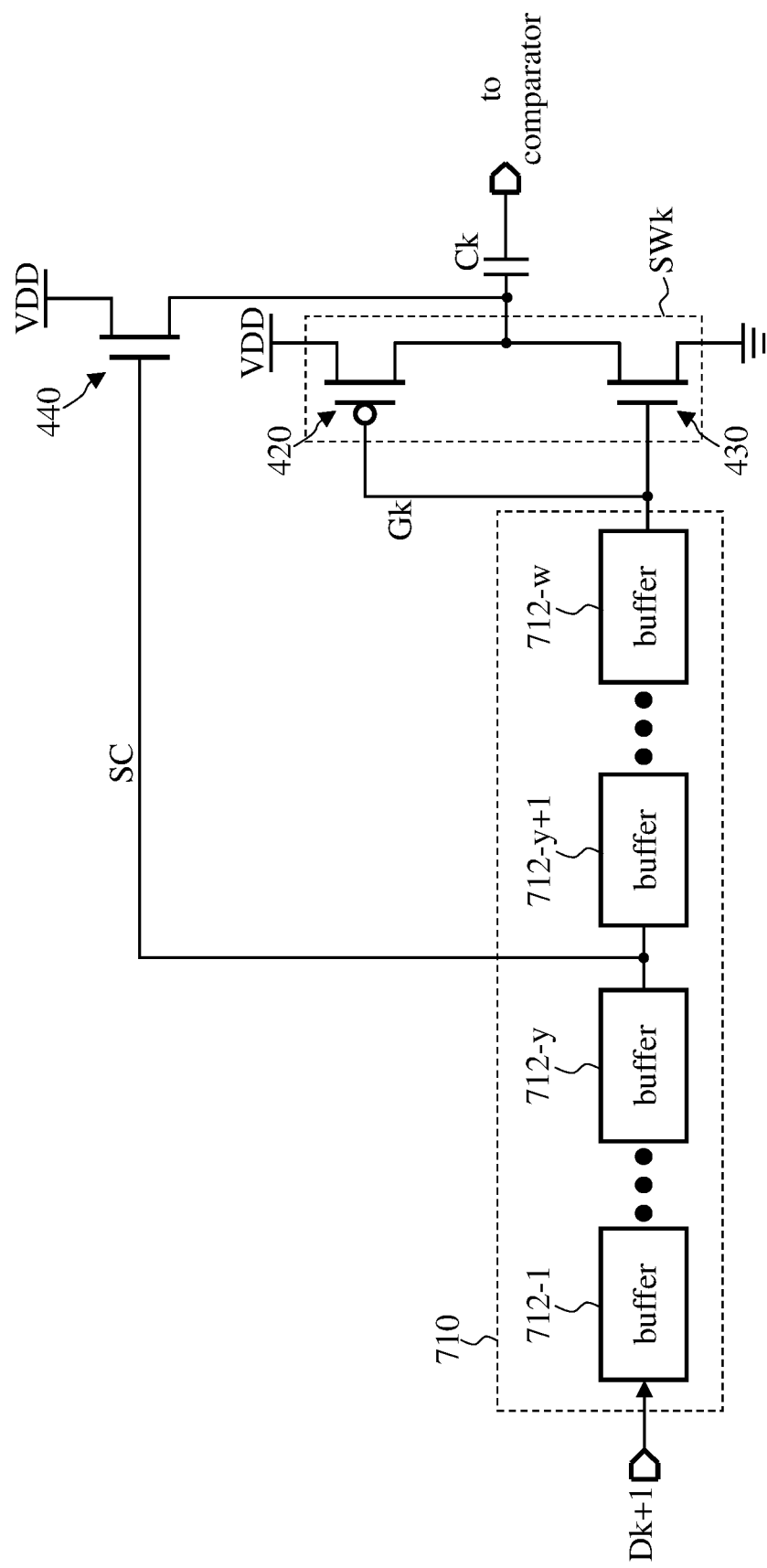
FIG. 7 is a circuit diagram of the sub-control circuit according to another embodiment of the present invention.

FIG. 7 is a circuit diagram of the sub-control circuit according to another embodiment of the present invention. The sub-control circuit is a part of the control circuit for the SAR ADC. The buffer circuit 710 includes w serially connected buffers 712 (712-1, . . . , 712-$y$, 712-$y$+1, . . . , 712-$w$, w>y≥1). The buffer can also be referred to as a driver, and each buffer 712 can be an inverter. This embodiment is similar to the embodiment of FIG. 6, except that in this embodiment the switch 440 is embodied by an NMOS. Therefore, in this embodiment, the switch control signal SC and the sub-control signal Gk are of different levels, that is, w is an odd number and y is an even number.

It should be noted that when the target capacitor in FIG. 7 is the capacitor Ck' instead of the capacitor Ck (i.e., when the sub-control circuit is coupled to the positive terminal of the comparator 120), w is an even number and y is an odd number.

In reference to FIG. 4 and FIG. 5, it should be noted that in some embodiments the turn-on resistance of the switch 440 can be less than or equal to the turn-on resistance of the switch 420 when the major concern for the circuit design is to lower the equivalent turn-on resistance between the bottom plate of the target capacitor Ck and the reference voltage Vref1.

In summary, the present invention provides a control circuit for a SAR ADC. The control circuit reduces the negative impact of the kickback noise of the comparator on the SAR ADC (i.e., improving the correctness of the SAR ADC) by enhancing the degree of impedance matching between the two input terminals of the comparator of the SAR ADC. In addition, the control circuit is also conducive to fast stabilization of the switched-capacitor DAC of the SAR ADC, which makes for the improvement to the performance of the SAR ADC (for example, the SAR ADC can operate at a higher speed).

Since a person having ordinary skill in the art can appreciate the implementation detail and the modification thereto of the present method invention through the disclosure of the device invention, repeated and redundant description is thus omitted. Furthermore, the shape, size, and ratio of any element and the step sequence of any flowchart in the disclosed figures are exemplary for understanding, not for limiting the scope of this invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A control circuit for a successive approximation register analog-to-digital converter (SAR ADC), the SAR ADC comprising a comparator and a switched-capacitor digital-to-analog converter (DAC) which comprises a target capacitor, a first terminal of the target capacitor being coupled to an input terminal of the comparator, a second terminal of the target capacitor being coupled to a first reference voltage through a first switch and coupled to a second reference voltage through a second switch, the control circuit comprising:
   a third switch coupled between the first reference voltage and the second terminal of the target capacitor; and
   a first buffer circuit coupled to the first switch and the third switch and configured to control the first switch and the third switch based on a control signal;
   wherein when the first switch and the third switch are turned on, the second switch is turned off, and when the second switch is turned on, the first switch and the third switch are turned off.

2. The control circuit of claim 1, further comprising:
   a second buffer circuit coupled to the second switch and configured to control the second switch based on the control signal.

3. The control circuit of claim 1, wherein based on the control signal, the first buffer circuit generates a first switch control signal that controls the first switch and generates a second switch control signal that controls the third switch, the first buffer circuit comprises a plurality of buffers, there are N buffer(s) between the control signal and the first switch control signal, and there are M buffer(s) between the control signal and the second switch control signal, N being greater than M.

4. The control circuit of claim 3, wherein the buffers are embodied by inverters, the first switch and the third switch are transistors of a same type, and N and M are both odd numbers or even numbers.

5. The control circuit of claim 3, wherein the buffers are embodied by inverters, the first switch and the third switch are transistors of different types, and one of N and M is an odd number and another of N and M is an even number.

6. The control circuit of claim 1, wherein a turn-on resistance of the first switch is smaller than a turn-on resistance of the third switch.

7. The control circuit of claim 1, wherein the first switch is a P-type MOSFET, and the first reference voltage is greater than the second reference voltage.

8. The control circuit of claim 7, wherein the third switch is a P-type MOSFET.

9. The control circuit of claim 1, wherein based on the control signal, the first buffer circuit generates a first switch control signal that controls the first switch and generates a second switch control signal that controls the third switch, and there is a delay between the first switch control signal and the second switch control signal.

10. The control circuit of claim 1, wherein the first switch and the second switch constitute an inverter.

* * * * *